United States Patent [19]

Bishop

[11] 4,204,319

[45] May 27, 1980

[54] TERMINAL PIN INSERTION DEVICE

[76] Inventor: Jack Bishop, 4729 Sara Dr., Torrance, Calif. 90503

[21] Appl. No.: 910,276

[22] Filed: May 30, 1978

Related U.S. Application Data

[63] Continuation-in-part of Ser. No. 794,012, May 5, 1977, abandoned.

[51] Int. Cl.$^2$ .............................................. H05K 3/30
[52] U.S. Cl. ........................................ 29/739; 29/837; 29/743
[58] Field of Search ................. 29/739, 741, 743, 757, 29/759, 625, 626

[56] References Cited
U.S. PATENT DOCUMENTS

| | | | |
|---|---|---|---|
| 3,924,325 | 12/1975 | Kufner | 29/626 |
| 3,963,456 | 6/1976 | Tsuchiya et al. | 29/739 |

*Primary Examiner*—Carl E. Hall
*Attorney, Agent, or Firm*—Singer & Singer

[57] ABSTRACT

This invention describes apparatus and method for inserting terminal pins into a circuit board regardless of the length of the pins or the thickness of the board. Loose pins are held in a suitable tray on a fixed plate having a plurality of holes similarly positioned with the holes on the circuit board. Located below the fixed plate is a movable pin assembly plate having a plurality of pin locators each positioned under a hole and each having a central opening for accepting a pin and holding a pin in an upright position. Vibrating the fixed plate causes the loose pins to fall through the holes in the plate and into the pin locators which hold the pins. A circuit board held by a backup plate is positioned over the fixed plate at a distance away from the fixed plate so as not to interfere with the excess loose pins lying on the plate. Moving the pin assembly plate in an upward direction causes the pins held in each of the pin locators to be inserted into the terminal board.

13 Claims, 16 Drawing Figures

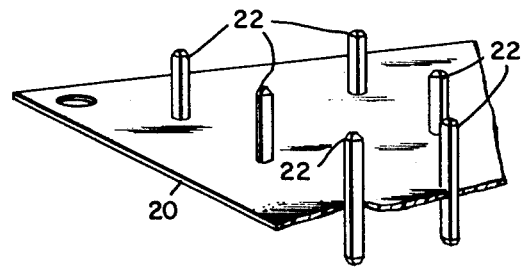
Fig. 1.
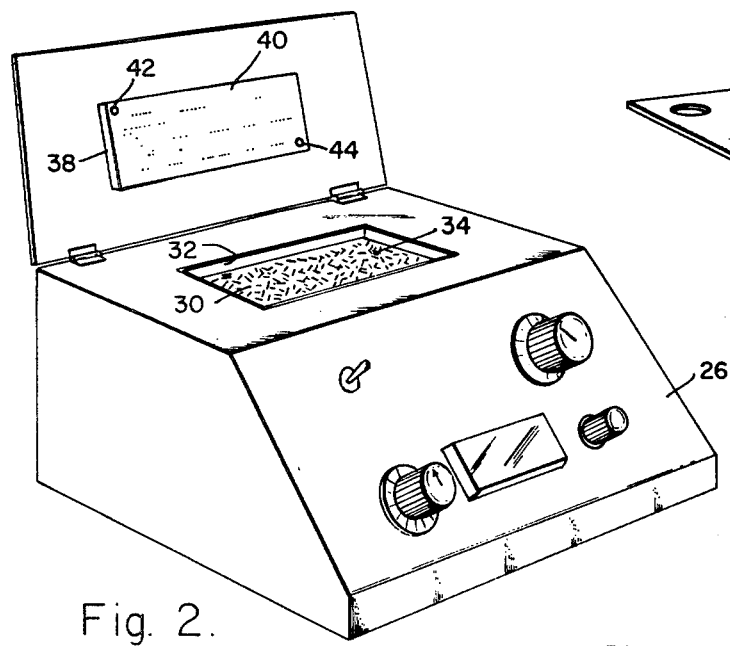
Fig. 2.
Fig. 3.
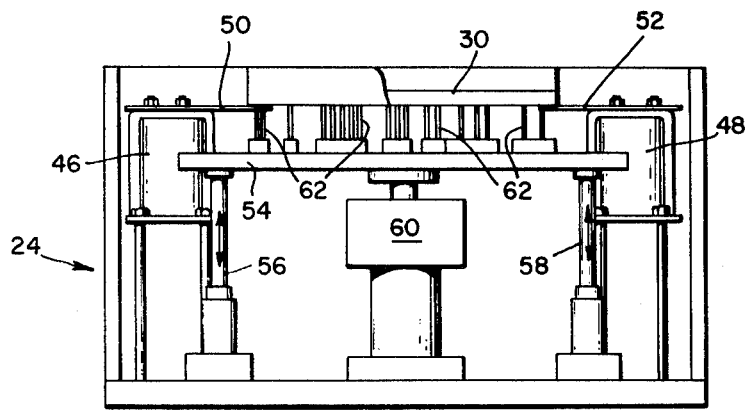
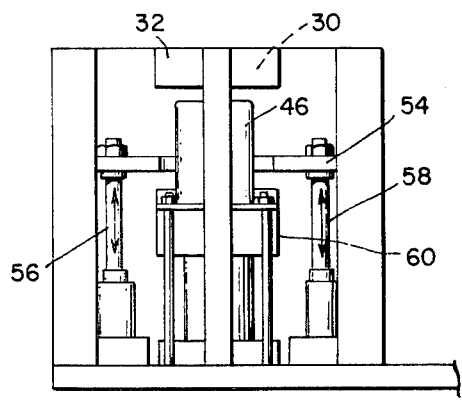
Fig. 4.
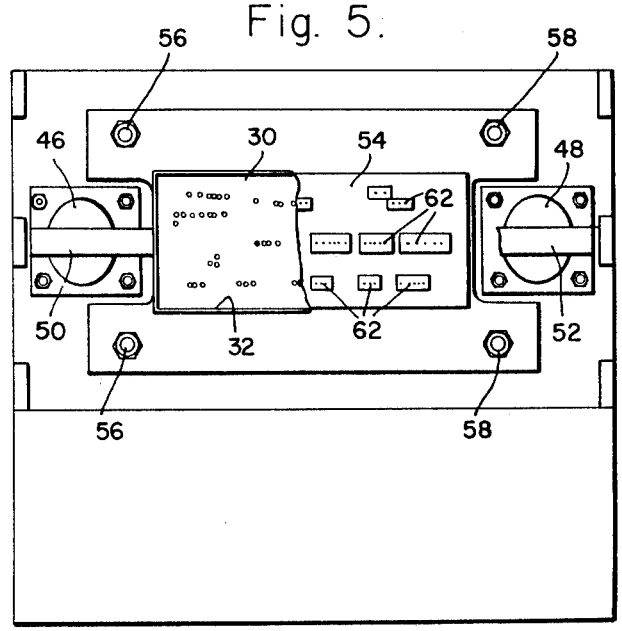
Fig. 5.

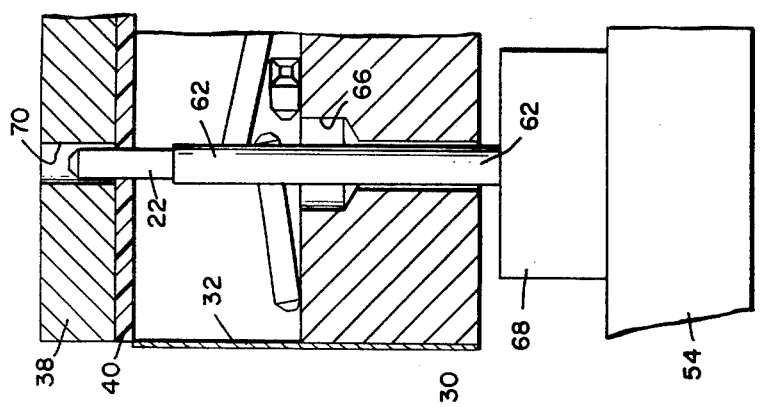
Fig. 9.
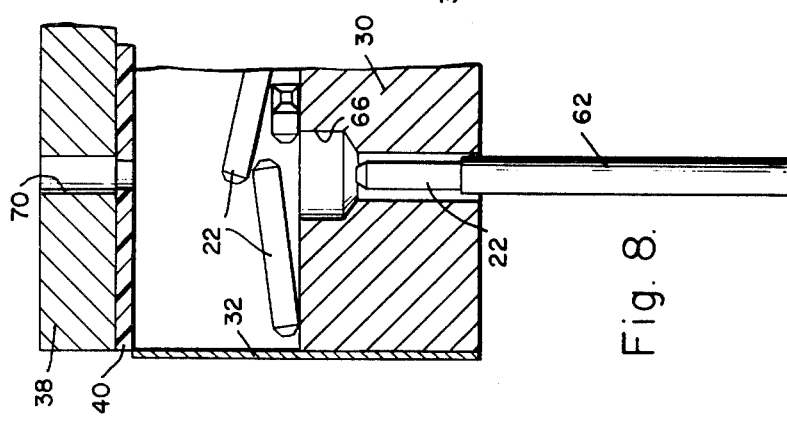
Fig. 8.
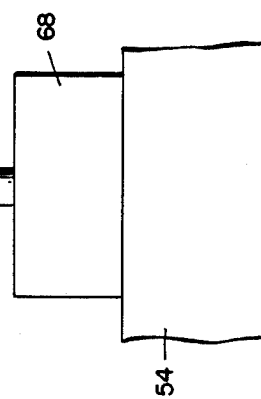
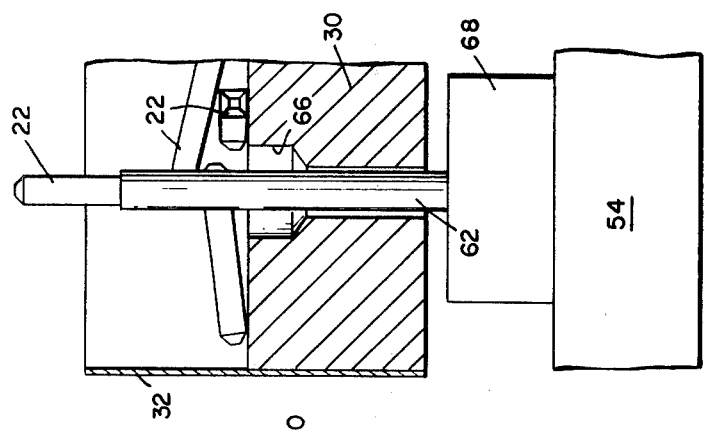
Fig. 7.
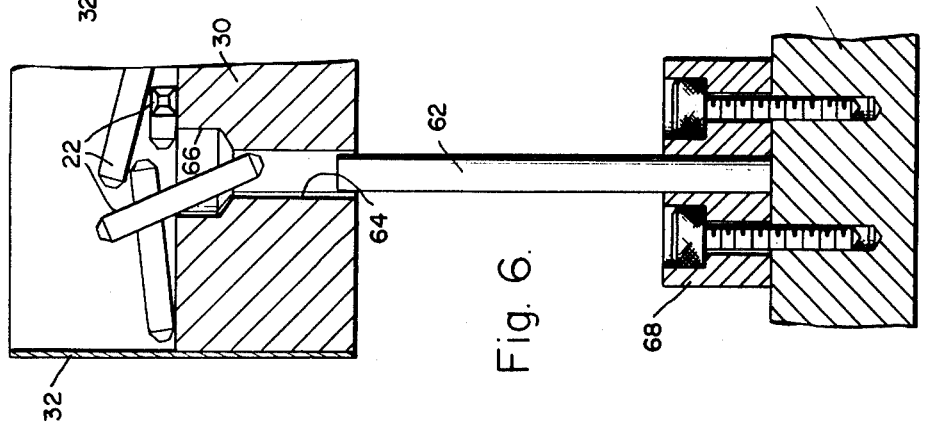
Fig. 6.
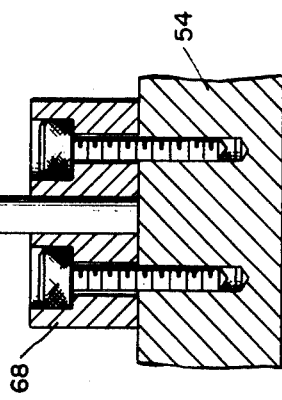

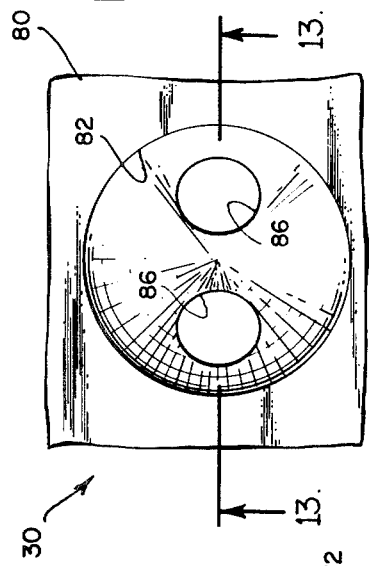
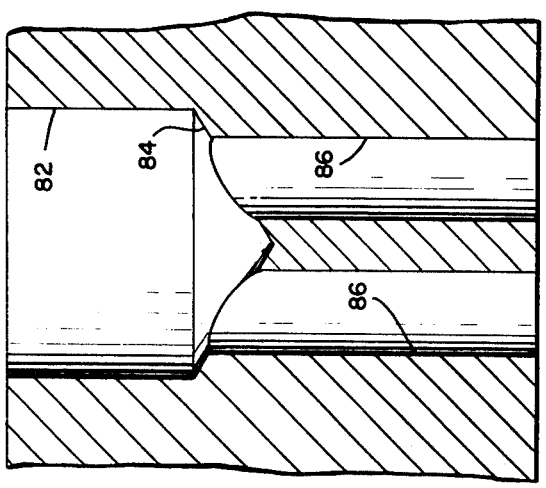
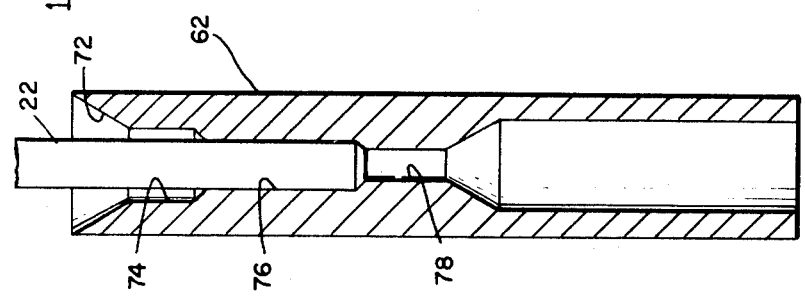
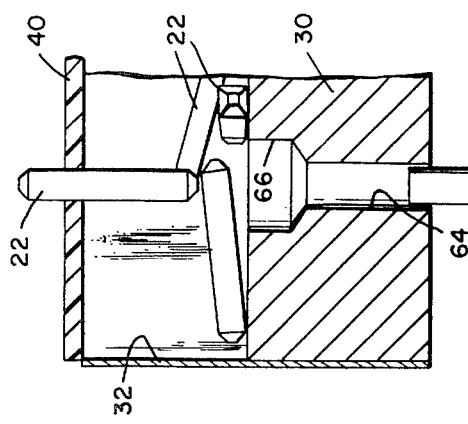
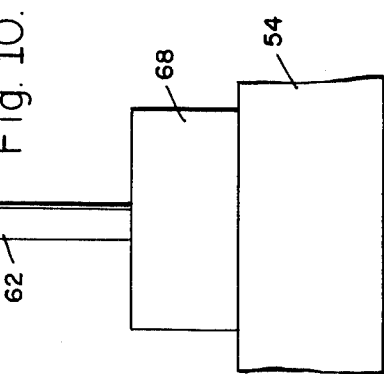

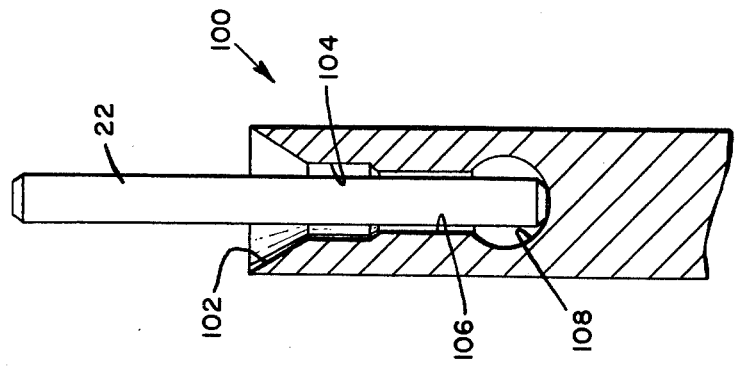
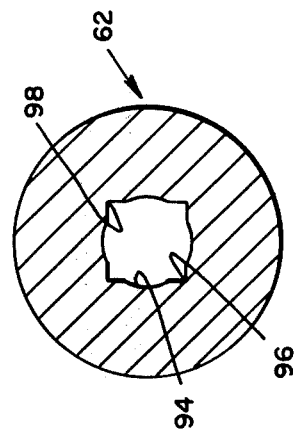
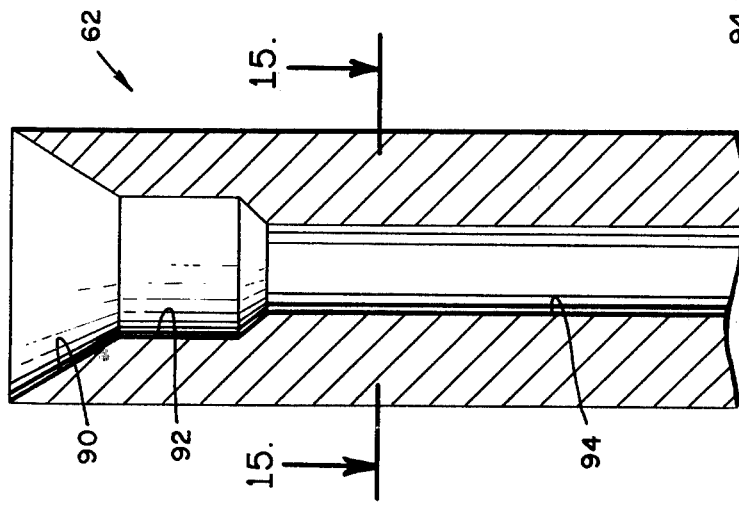

TERMINAL PIN INSERTION DEVICE

This is a continuation in part of previously filed patent application Ser. No. 794,012 filed May 5, 1977 and now abandoned.

This invention relates to a method and apparatus for inserting terminal pins in a circuit board irrespective of the length of the pins or the thickness of the circuit board.

Circuit boards are commonly used in the electronic industry as a convenient technique of supplying hard wired circuitry for specific applications. In the usual case a non-conductive substrate is covered with strips of conductive foil forming the hard wire conductors. Terminal pins inserted into the circuit board in discrete locations are used as terminal posts to interconnect the conductive foils and also to provide a support post for discrete components.

In order to preassemble the circuit board it is necessary to pre-drill the circuit board in those areas where terminal pins are to be inserted and to apply conductive foil in and around the circuit board so as to eliminate contact with undesired holes and pins and to make electrical contact with the desired holes and pins.

The prior art has been concerned with automating the insertion of terminal pins in circuit boards since it is quite obvious that it is time-consuming and expensive to insert terminal pins on a sequential one by one basis.

The underlying problem associated with the insertion of terminal pins in a circuit board is the alignment problems associated with holding a terminal pin and inserting the pin into the board.

The prior art is best exemplified by the Kufner, et al, U.S. Pat. No. 3,812,569, issued May 28, 1974.

The Kufner patent teaches a system of utilizing a feeding plate having a plurality of holes of relatively large diameter for accepting more than one pin. Cooperating with the feeding plate is a loading plate having a single axial hole communicating with the large holes in the feeding plate. Located below the feeding plate is a backing plate supporting a terminal board aligned with the loading plate.

Kufner indicates that by placing loose pins above the feeding plate and vibrating the complete assembly comprising the feeding plate, loading plate, backing plate and circuit board, that terminal pins will fall into the large holes in the feeding plate and subsequently a single pin will fall in each of the individual holes located in the loading plate. The holes in each loading plate provide an alignment means in the form of a square segment thereby aligning the pin as it falls onto the circuit board. In view of the interference fit between the terminal pin and the circuit board the individual terminal pin will simply rest on the terminal board and be held in alignment by the opening in the loading plate. At this point in time the vibration is stopped and the feeding plate is removed and a pressure plate placed over the loading plate forcing the loading plate down until the pins located in the holes of the loading plate are pushed into the circuit board.

The Kufner patent does in fact represent a significant advance in automating the insertion of terminal pins in circuit boards over the prior art existing at that time. Unfortunately, however, there are defects in the Kufner system that limit the usefulness of the system in a truly automated pin insertion device.

For example, the diameter and length of the openings in the feeding plate are restrictive of the length terminal pin that may be used. For different reasons not fully understood the diameter of the opening is critical to the maximum length terminal pin used.

In addition, the openings in the loading plate are extremely critical with respect to aligning the pins for insertion into the circuit board. The thickness of the loading plate is therefore critical to the length of the pin and the thickness of the terminal board.

The use of the Kufner system is further complicated by the fact that all elements must be vibrated simultaneously, that is including the feeding plate, the loading plate, the circuit board and the backing plate in order to allow the pins to enter the hole in the feeding plate and become aligned with the hole in the loading plate. Since the pins fall through the hole in the loading plate to contact the circuit board, it is also necessary for the circuit board and the backing plate to be similarly vibrated.

Actual insertion of the pins into the circuit board is only achieved after the feeding plate is removed and a pressure plate inserted in its place. This of course means that the loose terminal pins previously located on top of the feeding plate must first be removed in order to place the pressure plate against the loading plate.

The aforementioned difficulties have severely hampered the development of the art in fully automating the insertion of terminal pins in circuit boards.

In the practice of the present invention the aforementioned problems of the prior art have been eliminated and solved and in a manner that produces a fully automated terminal pin insertion system that is simple and expensive and extremely reliable without the difficulties mentioned above in connection with the Kufner system.

In this invention there is disclosed a system for automatically inserting terminal pins in selected locations in a circuit board that eliminates the disadvantages of the prior art devices and allows the use of different size terminal pins regardless of the thickness of the circuit board used.

The invention utilizes a movable pin assembly plate having a plurality of predetermined pin locators. Each of the pin locators has a central opening adapted to accept a single terminal pin and a depth determined by the penetration desired into the circuit board. The pin locator actually holds the terminal pin in position prior to insertion in the circuit board and hence the terminal pin is always properly aligned and physically held in position regardless of the length of the terminal pin being used and regardless of the thickness of the circuit board.

A fixed plate is located above the movable pin assembly plate and has a plurality of openings cooperating with each of the pin locators. The uppermost portion of the pin locator is normally positioned within the opening of a corresponding hole located in the fixed plate.

The fixed plate includes guard portions adapted to hold a plurality of loose terminal pins on the uppermost portion of the fixed plate. A vibrating device is connected to the fixed plate for selectively vibrating the fixed plate which has the effect of vibrating the pins until a single pin falls into the hole located in the fixed plate. The pin is caught by the pin locator attached to the pin assembly plate and is held in an upright vertical position.

A movable backup plate located above the fixed plate is adapted to hold a circuit board facing the fixed plate and in a unique relationship with respect to the pin assembly plate.

In operation, loose pins are placed on top of the fixed plate and within the guard area. The vibrating device is energized until a pin falls into each hole within the fixed plate, which pin is then caught and held by each pin locator attached to the assembly plate. At the same time the operator places a circuit board against the movable backup plate.

As an optional step the operator may raise the movable pin assembly plate which causes the pin locators holding the terminal pins to be moved up, thereby indicating to the operator that each pin locator does in fact contain a terminal pin. For a fully automated system it is envisioned that a light source located on the bottommost portion of the pin assembly plate and directed through each pin locator will provide an automatic means for determining if in fact a terminal pin is located in each pin locator. With a terminal pin located in each pin locator, no light will shine through the pin locators indicating that a terminal pin in each position is in place.

The operator may then sequentially or simultaneously lower the backup plate with the circuit board in place over the fixed plate in a preferred position just above the guard portions on the fixed plate, thereby obviating the need for removing the loose terminal pins located within the guard portion on the fixed plate.

The final step is achieved by moving the pin assembly plate in an upward direction, thereby causing each pin locator to push the terminal pins into the circuit board a predetermined amount determined only by the relative movement of the pin assembly plate.

A review of the structure and the method will show that only the fixed plate need be vibrated and that the terminal pins need not be removed from the guard portion on top of the fixed plate during the insertion phase.

In addition, the system provides a convenient means for holding each terminal pin in perfect alignment by means of the pin locators attached to the pin assembly plate thereby providing complete alignment regardless of the length of the terminal pins or the thickness of the circuit board used.

In the art of inserting pins into circuit boards, there is a strong demand for the use of substantially rectangular pins as opposed to round pins that have previously been used. The use of square pins is considered desirable by certain manufacturers because of the ease of attaching wire connectors in wrapping the connectors to the square pins.

In order to achieve uniformity in mounting the pins and in attaching components, it is considered desirable that all pins be aligned in the same direction and that the square pins not be inserted in the boards in a haphazard position.

This requirement has placed severe restraints and constraints on the equipment presently available to insert square pins into circuit boards.

In the present invention the pin locators used to hold the pins prior to insertion into the circuit board are constructed with substantially square holes in order to accept the square pins and also hold the pins in a preferred alignment as determined by the initial alignment of the pin locators.

In the preferred embodiment it has been found desirable to drill a hole in the pin locator having a diameter that is greater than the width of the square pin but less than the diagonal of the square. The square hole is then routed out from the circular hole in which the diagonal distance of the square routed-out hole is equal to the greatest diagonal distance of the pin.

Recognizing that the square pins do not have square corners but are rather slightly rounded during production, the procedure mentioned allows the pins to be accepted by the pin locator and oriented and held so as to align all square pins in a preferred direction for insertion into the circuit board.

Further objects and advantages of the present invention will be made more apparent by referring now to the accompanying drawings wherein:

FIG. 1 illustrates a partial cross-section of a circuit board containing a plurality of terminal pins;

FIG. 2 illustrates a conceptual view of the complete assembly for inserting terminal pins into a circuit board;

FIG. 3 illustrates a front view of FIG. 2 with the front cover removed;

FIG. 4 illustrates a side view of FIG. 2 with the side cover removed;

FIG. 5 illustrates a top view of FIG. 2 with the top cover removed;

FIGS. 6, 7, 8, 9 and 10 are sequential drawings illustrating the apparatus and method for automatically inserting pins into the circuit board;

FIG. 1 is a cross-section of a single pin locator holding a terminal pin;

FIG. 12 is a top view of a dual pin locator;

FIG. 13 is a cross-section of FIG. 12 along lines 13—13;

FIG. 14 is a partial cross-section of a pin locator for accepting square pins;

FIG. 15 is a section taken along lines 15—15 of FIG. 14; and

FIG. 16 is a cross-section of a second embodiment of a pin locator.

Referring now to FIG. 1, there is shown a circuit board 20 constructed of an insulative material and containing a plurality of terminal pins 22. In the usual case the individual terminal pins are square and the holes located within the terminal board 20 are round. The diagonal of the individual terminal pin 22 exceeds the diameter of the hole in the circuit board 20 thereby ensuring a friction fit between the terminal pin when pressed into the circuit board.

In the practice of the present invention where it is immaterial as to the specific configuration of the terminal pin relative to the hole in the circuit board, the only requirement is that a friction fit be obtained when inserting the terminal pin within the opening located in the circuit board. In those cases where it is important for the pins to be aligned, there is described pin locators having special inserts for accepting and aligning the pins. Similarly, the term "circuit board" is intended to include a printed circuit board such as a housing chassis or any other device adapted to receive a pin terminal or similar article as described.

Referring now to FIG. 2, there is shown a conceptual view of a machine 24 adapted to insert terminal pins into circuit boards. The front face may be slanted or straight and is adapted to receive and hold the necessary switches for controlling the operation of the machine. The uppermost portion 28 illustrates a fixed plate 30 having a guardrail 32 completely encompassing the periphery of the fixed plate 30. Located within the confines of the guardrail 32 are a plurality of terminal pins 34 that are loosely placed on the fixed plate 30.

A hinged cover 36 and movable with respect to the top cover 28 contains a backup plate 38 that is uniquely aligned with the fixed plate 30 so that the backup plate 38 with the cover 36 in the closed position will uniquely place the backup plate 38 over the fixed plate. A circuit board 40 is located over the backup plate 38 and held in a registered position by means of suitable locating pins 42 and 44.

The actual external configuration is a function of design only and is not intended to be a limitation on the description or use of the invention.

Referring now to FIG. 3, there is shown a front view of a machine 24 with the front side cover 26 removed, thereby exposing the internal workings of the machine.

Centrally located in the uppermost portion is the fixed plate 30 having guardrails 32 completely encompassing the fixed plate and which serve the purpose of holding the terminal pins in position when the fixed plate is vibrated.

Located on each side of the fixed plate 30 is a pair of heavy duty vibrating coils 46 and 48 adapted to hold and support the fixed plate 30 by means of straps 50 and 52, respectively. Energizing the coils 46 and 48 cause the straps 50 and 52 to vibrate thereby shaking and vibrating the fixed plate 30, guardrails 32 and any terminal pins located on the fixed plate 30.

In the preferred embodiment the operator will have a suitable rheostat for controlling the voltage to the vibrating coils 46 and 48 to thereby control the amplitude of vibrations which may be necessary to suitably vibrate the terminal pins located on the fixed plate, depending only on the size of the plate and the length of the pins being used. It is expected that longer pins will require more amplitude of movement to obtain the necessary action to cause the terminal pins to fall into the holes located in the fixed plate as will be described further.

Located below the fixed plate 30 is a movable pin assembly plate 54 that is capable of being moved in a vertical direction and which is supported at each end by locating pins 56 and 58. The purpose of locating pins 56 and 58 is to assure that the pin assembly plate 54 is moved in a truly vertical position at all times. The actual movement of the pin assembly plate 54 is controlled by a pump actuated cylinder 60 that is centrally located on the pin assembly plate 54. Energizing the pump actuated cylinder 60 will cause the pin assembly plate to either move up or down and only in a vertical direction. In the preferred embodiment a pneumatic pump and cylinder 60 was used, however, the actual mechanism for moving the pin assembly plate 54 is immaterial in the practice of the invention as long as the pin assembly plate can be moved in a vertical direction at the discretion of the operator.

Located on top of the pin assembly plate 54 are a plurality of pin locators 62 which may either hold one or more of the terminal pins. The actual description of the pin locators will be described in connection with FIGS. 11, 12 and 13.

Each pin locator 62 contains a central opening adapted to receive a terminal pin and a depth determined by the penetration desired into the circuit board. In the preferred embodiment it is envisioned that the pin locators will be hollow and simply contain a restricted diameter opening to prevent penetration of the terminal pin and thereby provide support for the terminal pin when being held.

The individual pin locators 62 are uniquely positioned on the pin assembly plate to be directly aligned with the individual openings in the fixed plate 30.

The unique relationship requires that the backup plate 38 holding the circuit board 40 when located over the fixed plate 30 provide the unique alignment of the holes in the circuit board with the holes in the fixed plate 30 and aligned with the plurality of pin locators 62 which are adapted to penetrate through the holes located in the fixed plate.

Referring now to FIGS. 4 and 5, there is illustrated a side view of the machine illustrated in FIG. 3 and the top view of the machine as illustrated in FIG. 3. FIG. 5 more fully illustrates the two pairs of locating pins 56 and 58 which hold and support the pin assembly plate 54 as it moves in a vertical direction. The fixed plate 30 is shown with a cutaway section to more fully illustrate the registration and alignment of the pin assembly plate 54 located directly below the fixed plate 30.

FIGS. 6, 7, 8, 9 and 10 illustrate a sequence of drawings showing a preferred method and operation for inserting terminal pins 22 in a circuit board.

Referring now to FIG. 6, there is shown a partial cross-sectional view of the fixed plate 30 illustrating the relationship of the pin assembly plate 54 and a pin locator 62 in the normal or starting position.

FIG. 6 illustrates the pin opening 64 located in the fixed plate 30. The uppermost portion of the pin opening 64 contains an enlarged diameter 66 which is intended to facilitate the movement of the individual pin 22 into the opening 64.

The individual pin locator 62 is physically positioned and held on the pin assembly plate 54 by means of locating blocks 68 that are removably engaged with the pin assembly plate. The purpose of the locating blocks 68 is to hold and position the individual pin locators 62 in the desired alignment position with respect to the pin opening 64 in the fixed plate 30.

FIG. 6 illustrates the starting position in which the pin assembly plate 54 is in the lowermost position and which allows one end of the pin locator 62 to enter the pin opening 64 in the fixed plate 30. In this position the operator places a plurality of pins 22 on the uppermost surface of the fixed plate 30 and within the confines of the guardrails 32. The individual vibrating coils 46 and 48 are energized which cause the individual pins 22 to move around until the individual pin falls into the enlarged opening 66 associated with each pin opening 64. The individual pin 22 is caught and held within the pin locator 62 and in a vertical upright position.

Referring now to FIG. 7, there is shown an optional step in which the operator energizes the cylinder 60 which raises the pin assembly plate 54 to thereby push the pin locator 62 through the pin opening 64 in the fixed plate 30 which thereby allows the operator to physically view the terminal pin 22 located within the pin locator 62. This step is considered optional because it is not necessary to the normal sequence but does provide an independent means to determine that a terminal pin 22 did in fact fall within each of the openings located in the fixed plate 30.

FIG. 8 illustrates the next step in which the cylinder 60 is retracted and allows the pin assembly plate 54 to return to the original position as shown in FIG. 6 while at the same time the operator closes the upper cover 36 thereby placing the back plate 38 and the terminal board 40 over the guardrails 32 in alignment with fixed plate 30.

It will be observed that in this position it is not necessary to remove the loose terminal pins 22 that are laying on necessary to remove the loose terminal pins 22 that are laying on the fixed plate 30 since the backup plate 38 holds the circuit board 40 in alignment over the fixed plate 30 and in a displaced position which obviates the need of removing the loose terminal pins 22.

An alternate method allows the operator to go directly from FIG. 6 to FIG. 8 by simply energizing the vibrating coils while at the same time loading the circuit board 40 on the backup plate 38 and placing the backup plate over the fixed plate 30 as shown in FIG. 8 thereby accomplishing the steps illustrated in FIGS. 6, 7 and 8 in one step rather than in three alternate steps.

FIG. 8 also illustrates a pin opening 70 in the backup plate 38, which opening is aligned with the hole in the terminal board 40. The diameter of the pin opening 70 is larger than the hole in the circuit board 40 and is provided to allow penetration of the individual pin 22 when the pin is finally inserted in the circuit board.

Referring now to FIG. 9, there is shown the step of energizing cylinder 60 which raises the pin assembly plate 54 to thereby force pin 22 into the circuit board 40. The travel of the cylinder 60 and the movement of the pin assembly plate 54 is fixed and the operator need not be concerned with the length of the stroke or travel of the pin assembly plate. The actual penetration of the terminal pin 22 into the circuit board 40 is a function of the depth of the opening within the individual pin locator 62 and which is preset in advance for any given circuit board, thereby freeing the operator from making the value judgment but simply be concerned only with inserting the board and operating the cylinder 60 in sequence.

Referring now to FIG. 10, there is shown the pin assembly plate 54 returned to the lowermost position by means of the cylinder 60 and which again places the pin locator 62 just within the pin opening 64 in the fixed plate 30. The backup plate 38 has been removed, thereby leaving the circuit board 40 in position with all of the pins 22 pressed in place and ready to be removed by the operator.

The sequence is again repeated as described in connection with FIG. 6.

Referring now to FIG. 11, there is shown a cross-section of a single pin locator 62 holding a terminal pin 22.

In the preferred embodiment the uppermost portion of the pin locator 62 contains an enlarged tapered opening 72 to facilitate the entry of the individual pin 22. The tapered opening 72 communicates with an enlarged cylindrical diameter opening 74 which in turn communicates with a reduced diameter cylindrical opening 76 that provides a sliding fit with the diameter of the terminal pin 22.

The longitudinal length of the elongated opening 76 terminates in a reduced diameter 78 that is substantially less than the diameter of the terminal pin 22 and which provides a terminal portion for the end of the terminal pin 22 for holding the terminal pin in position at the depth as determined by the reduced diameter 78.

In the preferred embodiment the length of cylindrical opening 76 provides the alignment of the pin 22 whereas the location of the reduced diameter 78 determines the depth of penetration of the pin 22 into the terminal board 40.

Referring now to FIG. 12, there is shown a dual pin locator 80 adapted to accept two separate pins 22.

Depending on the individual requirements of the circuit board, it is possible that pins may be placed extremely close together for electrical reasons completely beyond the control of the mechanical designer of the board. For these situations it has been found desirable to reduce the spacing between adjacent pin locators to an absolute minimum and without sacrificing the benefits to be derived from automatically inserting pins in the circuit board as taught by the present invention.

The dual pin locator 80 provides a convenient mechanism for reducing the physical distance between adjacent terminal pins and still preserve the benefits of the present invention. A large diameter opening 82 is located in the uppermost portion of the dual pin locator 80 to facilitate the entry of the terminal pins 22 during the initial period when the fixed plate 30 is vibrated. The initial depth of the enlarged diameter 82 terminates into a tapered opening 84 which in turn communicates with at least two longitudinal openings having a diameter 86 that provides for a slip fit with the diameter of the individual pin locators 62.

In this manner it is possible to locate a pair of pin locators 62 close together and with a minimum thickness between the pin locators. It is also possible to include an additional opening 86 and possibly two additional openings 86 should it be necessary to place as many as four pins in close proximity to each other.

In the usual case it is only necessary to place pins close together in a side by side relationship; however, the capability of placing three or even four pins in close proximity to each other is possible with the embodiment illustrated in FIGS. 12 and 13.

Referring now to FIG. 14, there is shown a cross-sectional view of a single pin locator 62.

The outward appearance of the single pin locator 62 is identical to that shown in FIG. 11, however, the internal configuration is such that square pins are accepted within the enlarged tapered opening 90. The tapered opening 90 communicates with an enlarged cylindrical diameter opening 92 which in turn communicates with a reduced diameter opening 94 that is adapted to hold and orient the square pins.

Referring now to FIG. 15, there is shown a cross-sectional view of FIG. 14 taken along lines 15—15.

Opening 94 will have a diameter that is greater than the width of the pin but less than the diagonal of the square pin. The bore 94 is either broached or electrical discharge machined to a square in which the distance between point to point as measured between 96 and 98 is equal to the greatest diagonal distance of the square pin. In this fashion the pin falling into the pin locator 62 will be urged into the bore 94 so that the square points are aligned with points 96 and 98 thereby effectively holding the square pin and also aligning the pin in a preferred direction.

For a typical installation, square pins having a width of 0.045 inch are being used. The diagonal for such pins will vary from 0.056 to 0.059. For these pins the diameter of the hole 94 is made approximately 0.052 inch which is greater than the width of the pin but less than the smallest diagonal distance of the pin. The diagonal distance measured between point 96 and 98 of the opening for this illustration is made 0.059 inch which is the greatest diagonal distance of the pin. In actual production the corners of the square pins are slightly rounded during a tumbling action which provides the necessary clearance to allow the pin sufficient room to be held by the pin locator and oriented in a single but preferred direction.

Referring now to FIG. 16, there is shown a cross-sectional view of a second embodiment of a pin locator holding a terminal pin 22 and which performs the same function as pin locator 62 illustrated in FIG. 11.

The uppermost portion of the pin locator 100 contains an enlarged tapered opening 102 to facilitate the entry of the individual pin 22. The tapered opening 102 communicates with an enlarged cylindrical opening 104 which in turn communicates with opening 106 to provide a sliding fit for terminal pin 22.

The cross-sectional view of opening 106 will be circular to accept a circular pin 22 or will have a cross-sectional view similar to the cross-sectional view of the pin actually being used for alignment purposes. For a square pin the cross-sectional view of opening 106 will be substantially square and as illustrated in FIG. 15.

Opening 106 will terminate in a transverse opening 108 that provides the limit of penetration of pin 22.

I claim:

1. A system for inserting terminal pins in selected locations in a circuit board comprising:
   a movable pin assembly plate having a plurality of predetermined pin locators,
   each of said pin locators having a central opening for accepting a terminal pin and having a depth to support said pin in a vertical position,
   a fixed plate located above said movable pin assembly plate having a plurality of openings cooperating with each of said pin locators whereby movement of said pin assembly plate inserts each of said pin locators through each of said openings in said fixed plate,
   said fixed plate having guard portions for holding a plurality of loose terminal pins on the uppermost portion of the fixed plate,
   a vibrating device connected to said fixed plate for selectively vibrating said fixed plate whereby a loose terminal pin falls through each of said openings in the fixed plate and into the pin locators cooperating with each opening, and
   a movable backup plate for holding a circuit board facing said fixed plate and in a unique relationship with respect to said pin assembly plate whereby moving said backup plate and said pin assembly plate towards each other causes terminal pins in each pin locator to be inserted in the terminal board.

2. A system according to claim 1 in which said movable pin assembly plate is selectively movable in a vertical direction only while still maintaining a unique alignment relationship with the openings located in said fixed plate.

3. A system according to claim 1 in which the uppermost portion of each of said pin locators is located within each of the openings in said fixed plate.

4. A system according to claim 1 in which each of said pin locators is movably positioned on said pin assembly plate whereby alignment of each pin locator with the opening in the fixed plate is maintained.

5. A system according to claim 1 in which each pin locator contains an enlarged diameter opening in the uppermost portion for accepting a terminal pin and a reduced diameter portion for holding the terminal pin in a desired position.

6. A system according to claim 1 in which each pin locator has a shaped internal diameter corresponding to the shape of the pin being used to hold and align the terminal pin in a desired position.

7. A system according to claim 6 in which the reduced diameter portion approximates a square for holding square pins.

8. A system according to claim 7 in which the reduced diameter portion is less than the width of the square pin and the diagonal portion of the opening is equal to or greater than the diagonal of the square pin.

9. A system according to claim 1 in which said fixed plate contains a plurality of closely spaced pin openings having a single large access opening.

10. A system according to claim 9 which contains a pair of pin openings.

11. A system according to claim 9 which contains a single pin locator for each pin opening.

12. A system according to claim 1 in which said movable backup plate is placed over said fixed plate and at a distance determined by the height of said guard portions.

13. A system according to claim 1 in which each pin locator contains an enlarged diameter opening in the uppermost portion for accepting a terminal pin and a transverse opening for limiting the penetration of the pin and holding the pin in a desired position.

* * * * *